United States Patent
Weissinger

(10) Patent No.: US 7,174,498 B2
(45) Date of Patent: Feb. 6, 2007

(54) OBTAINING CYCLIC REDUNDANCY CODE

(75) Inventor: Steve H. Weissinger, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 438 days.

(21) Appl. No.: 10/076,975

(22) Filed: Feb. 15, 2002

(65) Prior Publication Data

US 2003/0200500 A1    Oct. 23, 2003

(51) Int. Cl.
   *H03M 13/00*    (2006.01)
(52) U.S. Cl. .................. 714/785; 714/781; 714/808
(58) Field of Classification Search ............ 714/752, 714/758, 757, 781, 799, 800, 808
   See application file for complete search history.

(56) References Cited

U.S. PATENT DOCUMENTS

| 5,619,516 | A  | * | 4/1997  | Li et al. ................. 714/807 |
| 5,951,707 | A  | * | 9/1999  | Christensen et al. ........ 714/752 |
| 6,052,815 | A  |   | 4/2000  | Zook |
| 6,438,724 | B1 | * | 8/2002  | Cox et al. ................ 714/758 |
| 6,820,232 | B2 | * | 11/2004 | Kim et al. ................ 714/781 |

FOREIGN PATENT DOCUMENTS

EP       0 609 595       8/1994

OTHER PUBLICATIONS

Roginsky et al., Efficient computation of packet CRC from partial CRCs with application to the □□Cells-In-Frames protocol, 1998, Computer Communications 2 1, pp. 654-661.*

Glaise et al., Fast CRC Calculation, 1993, IEEE.*
Feldmeier, Fast Software Implementation of Error Detection Codes, Dec. 1995, IEEE/ACM□□Transactions on Networking, vol. 3, No. 6.*
Glaise et al., *Fast CRC Calculation*, 1993, IEEE.
Feldmeier, *Fast Software Implementation of Error Detection Codes*, Dec. 1995, IEEE/ACM Transactions on Networking, vol. 3, No. 6.
Glaise, *A two-step computation of cyclic redundancy code CRC-32 for ATM networks*, Nov. 1997, IBM J. Res. Develop., vol. 41 No. 6.
Roginsky et al., *Efficient computation of packet CRC from partial CRCs with application to the Cells-In-Frames protocol*, 1998, Computer Communications 21, pp. 654-661.
Joshi et al., *A New Parallel Algorithm for CRC Generation*, 2000, IEEE, pp. 1764-1768.
Roginsky, A., et al., "Efficient computation of packet CRC from partial CRCs with application to the Cells-In-Frames protocol", *Computer Communications*, 21(7):654-661 (1998).

* cited by examiner

*Primary Examiner*—Albert Decady
*Assistant Examiner*—John J. Tabone, Jr.
(74) *Attorney, Agent, or Firm*—Fish & Richardson P.C.

(57) ABSTRACT

Cyclic redundancy codes are obtained to verify the integrity of a message transmitted between a sender and a receiver. One method for obtaining a cyclic redundancy code includes separating the message into segments. Remainders are obtained for those segments based on a generator polynomial. The remainders for those segments are multiplied by a segment-constant to obtain segment-remainders for each segment. The segment-remainders are accumulated into an accumulated-remainder. The accumulated-remainder is moduloed by the generator polynomial to obtain a remainder for the accumulated-remainder. The remainder for the accumulated-remainder is the cyclic redundancy code for the message.

35 Claims, 10 Drawing Sheets

OBTAINING CYCLIC REDUNDANCY CODE

TECHNICAL FIELD

This application relates to verifying the integrity of data transmissions, and more particularly, to verifying the integrity of digital data transmissions using cyclic redundancy codes.

BACKGROUND

Data transmission 10 (FIG. 1) involves a transfer of information known as data between a sender 12 and a receiver 14. Often, data transmission 10 includes information transmitted as digital bits of ones and zeros, represented here by $m_{n-1}$ to $m_0$, and referred to as a message M.

In a perfect world, message M transmits free of errors. Unfortunately, errors are often introduced though medium 16 by which message M travels from sender 12 to receiver 14 (e.g., medium 16 may be any combination of wire, cable, fiber-optic, air, or link layer devices). One method for detecting the presence of errors in message M employs cyclic redundancy codes.

Cyclic redundancy codes treat groupings of digital bits like message M as a polynomial where each bit in the grouping represents a coefficient in the polynomial $X^{n-1}+X^{n-2}+X^0$. For example, a group of eight bits 11001101 may be represented by polynomial $X^7+X^6+X^3+X^2+1$ (i.e., $1*X^7+1*X^6+0*X^5+0*X^4+1*X^3+1*X^2+0*X^1+1*X^0$).

These polynomials form an algebraic object known as a commutative ring with coefficients in Z/p where Z are the integers and p is a prime number, here 2, also known as {0,1} modulo 2. A non empty set R together with two binary operations {+*} is called a ring if (R+) is an abelian group, (R*) is a semi group and the distributive laws are obeyed, (i.e. $a*(b+c)=a*b+a*b$).

In polynomial rings, there are no carries or borrows from one coefficient to the next. In arithmetic modulo 2, addition and subtraction are identical and may be implemented with exclusive-or.

```
  10111011     10110011     11110000     00010101
 +11001110    +11000101    -00100110    -10101111
  01110101     01110110     11010110     10111010
```

Division of polynomials represented as groups of bits is completed in a manner similar to binary division except subtraction is done in modulo2. A divisor will 'go into' a dividend if the dividend polynomial is of the same degree as the divisor polynomial (i.e., the divisor and dividend share at least the same most significant bit).

A cyclic redundancy code may be obtained by calculating the remainder for message M divided by a generator polynomial P. This remainder is called a cyclic redundancy code ("CRC").

To obtain a CRC for a message M, the group of bits to be divided by generator polynomial P may include appended zero-bits 17. Zero-bits 17 are equal in number to the degree of generator polynomial P. Thus, the CRC of a message M=10111000 having three appended zero-bits 17 based on a generator polynomial $P=X^3+1=1001$ of degree three (i.e., where $X^3$ is the most significant bit of polynomial P) may be calculated as follows:

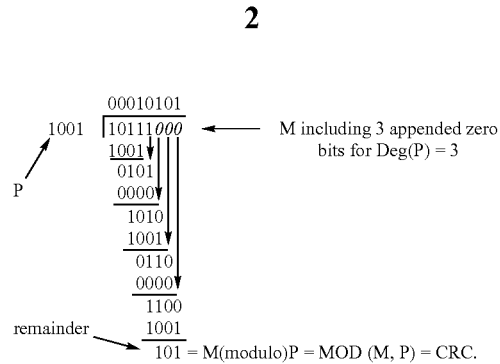

The resulting remainder, shown as CRC 18, may be appended to message M, replacing zero bits 17, to create a message M'. Sender 12 transmits message M' via medium 16 to receiver 14 as data transmission 10.

Upon receipt, receiver 14 divides message M' by the same generator polynomial P to obtain a CRC for M' and check the validity of data transmission 10. If the resulting remainder is zero (i.e., CRC=M'(modulo)P=0), the integrity of data transmission 10 is confirmed. For example:

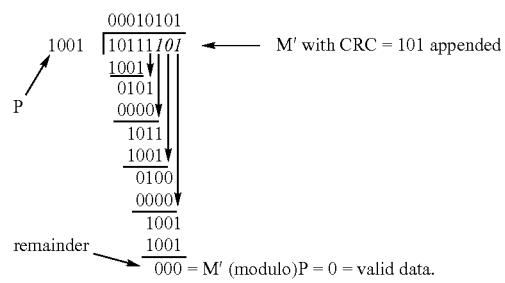

If the remainder of message M' divided by polynomial P is not zero (i.e., CRC=M'(modulo)P≠0), data transmission 10 contains one or more errors. For example:

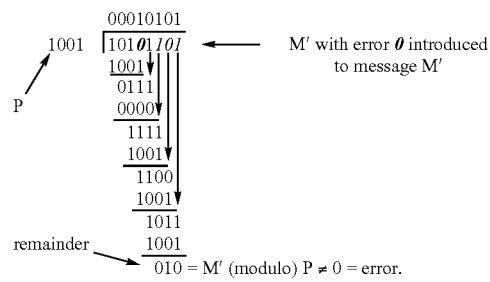

DESCRIPTION OF DRAWINGS

Like reference symbols in the various drawings indicate like elements.

DETAILED DESCRIPTION

Figure 1:
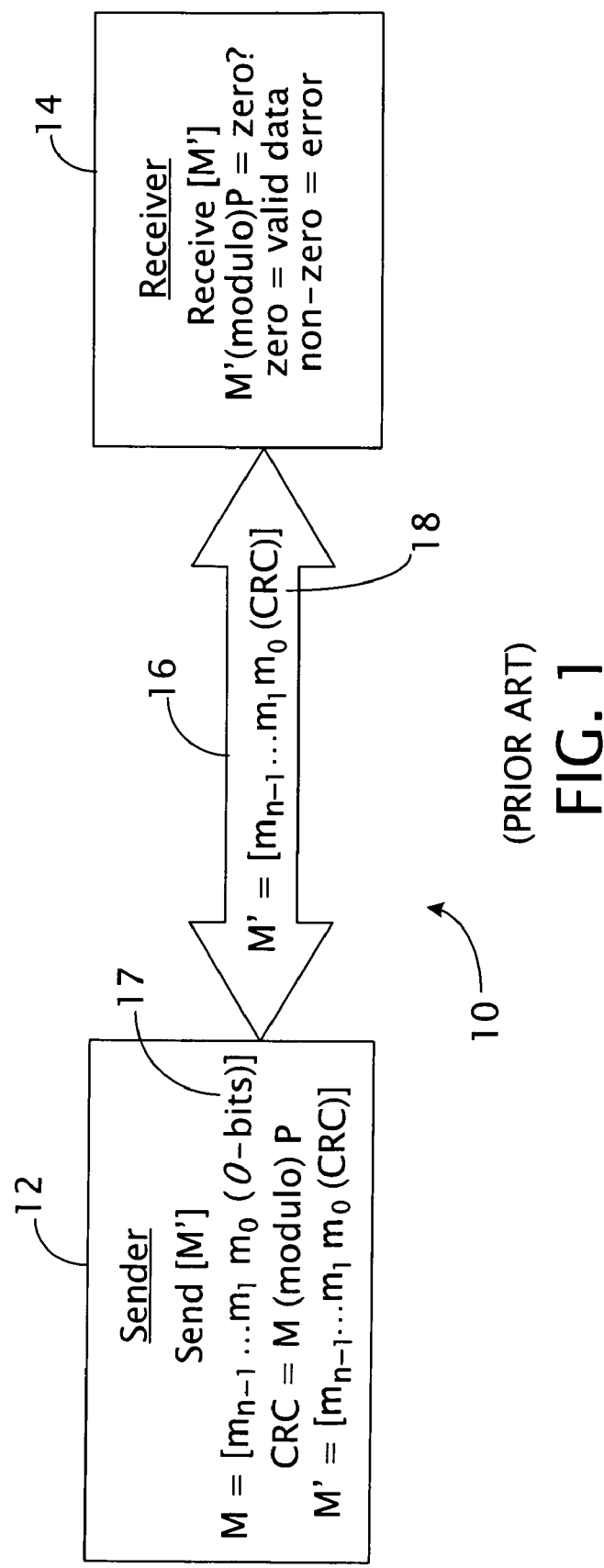
FIG. 1 shows a prior art block diagram of a data transmission employing cyclic redundancy codes.
Figure 2:
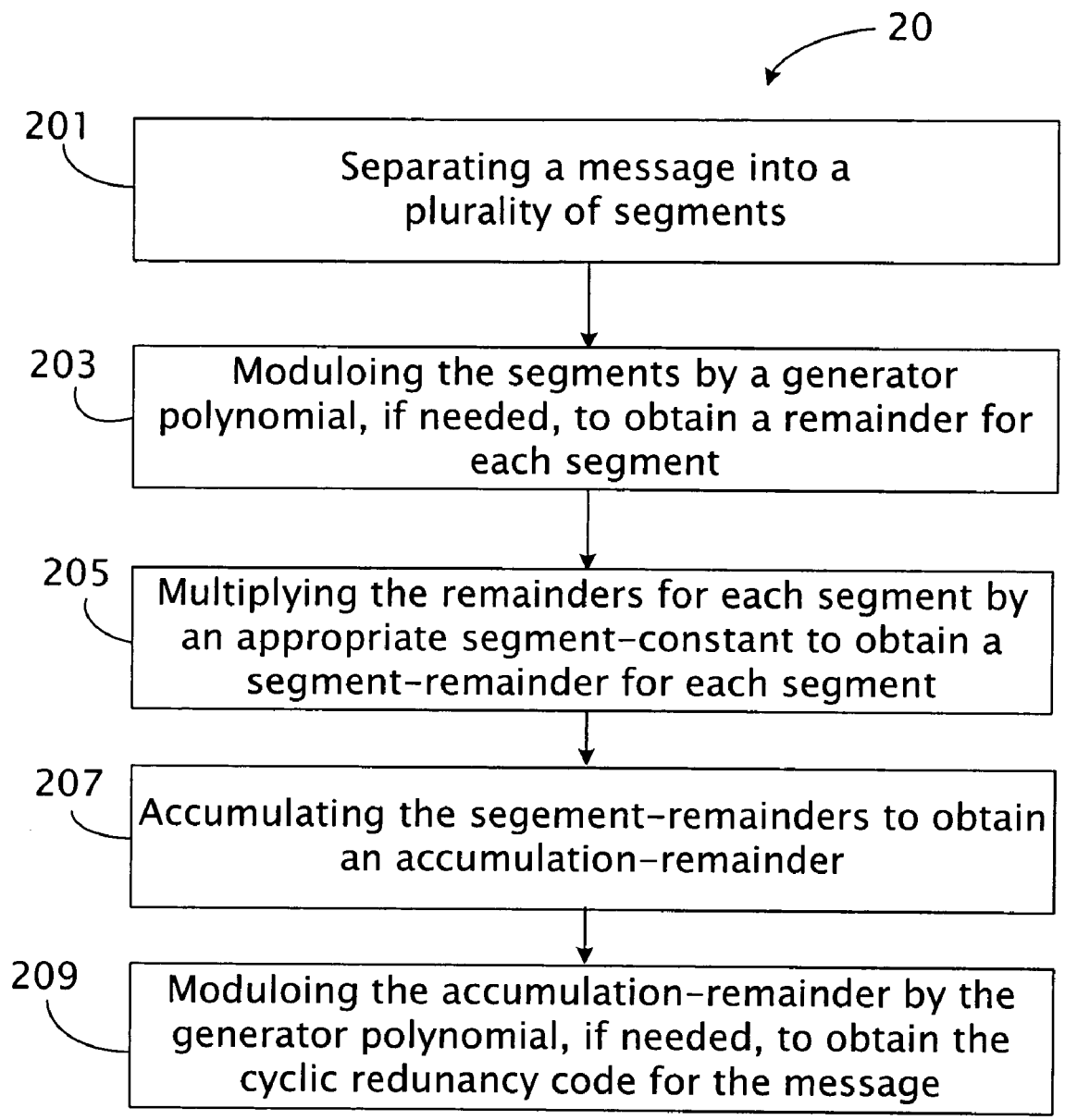
FIG. 2 shows a process for obtaining a CRC where a message M is separated into a plurality of segments.

Process 20 (FIG. 2) obtains a CRC for a message M based on a generator polynomial P.

Process 20 includes separating (201) a message M into a plurality of message segments $M_s$; moduloing (defined below) (203) the message segments by a generator polynomial P, if needed, to obtain a remainder R for each segment; multiplying (205) the remainder R for each segment by an appropriate segment-constant C to obtain a segment-remainder SR for each segment $M_s$; accumulating (207) the segment-remainders SR for each segment $M_s$ to obtain an accumulated-remainder AR for message M; and moduloing (209) the accumulated-remainder by generator polynomial P, if needed, to obtain the CRC for message M.

Separating (201) message M into a plurality of message segments $M_s$ includes parsing message M so that:

$$M = M_{s-1} * X^{n*(s-1)} + M_{s-2} * X^{n*(s-2)} \ldots + M_1 * X^{n(1)} + M_0 * X^{n(0)};$$

where s is the number of segments into which message M is separated, n is the number of bits in each segment, X is the position of each segment in message M, and $M_s$ are the individual segments of message M. If the number of bits is n, then X is of the form X=[1000 . . . 0] where there are n zeroes, n+1 elements, and X is of degree n. Multiplying M by X will shift the message left by n bits. Multiplying M by $X^2$ will shift the message by 2n bits (and so on).

Moduloing (203) includes obtaining a remainder R for each message segment $M_s$ by dividing segment $M_s$ by generator polynomial P if the degree of the most significant bit of segment $M_s$ is the same as or greater than the degree of the most significant bit of polynomial P. If the degree of segment $M_s$ is less than the degree of polynomial P (i.e., where the most significant bit of $M_s$ is smaller than the most significant bit of polynomial P) moduloing (203) is not needed since the remainder for message segment $M_s$ equals segment $M_s$ itself. In alternate embodiments moduloing (203) may be accomplished by multiplying message segment $M_s$ by a reciprocal approximation for polynomial P, rather than dividing segment $M_s$ by polynomial P. to obtain remainder R for message segment $M_s$. The operation of multiplication by reciprocal approximation to obtain a remainder R is discussed in connection with FIG. 6 below.

Multiplying (205) includes obtaining segment-constant C (defined below) for each message segment $M_s$ and multiplying each segment-constant C by its remainder R to obtain a segment-remainder SR for each message segment. Segment-constants C may be obtained based on the position X of message segment $M_s$ in message M modulo generator polynomial P or modulo a field extension of P.

Accumulation (207) includes adding the segment-remainders SR for each message segment $M_s$ to obtain an accumulated-remainder AR for message M.

Moduloing (209) includes dividing accumulated-remainder AR by generator polynomial P, or multiplying AR by a reciprocal approximation of generator polynomial P, to obtain a CRC for message M. However, if the degree of accumulated-remainder AR is less than the degree of polynomial P, moduloing (209) is not needed since the remainder (i.e., the CRC) of message M is accumulated-remainder AR.

Figure 3:
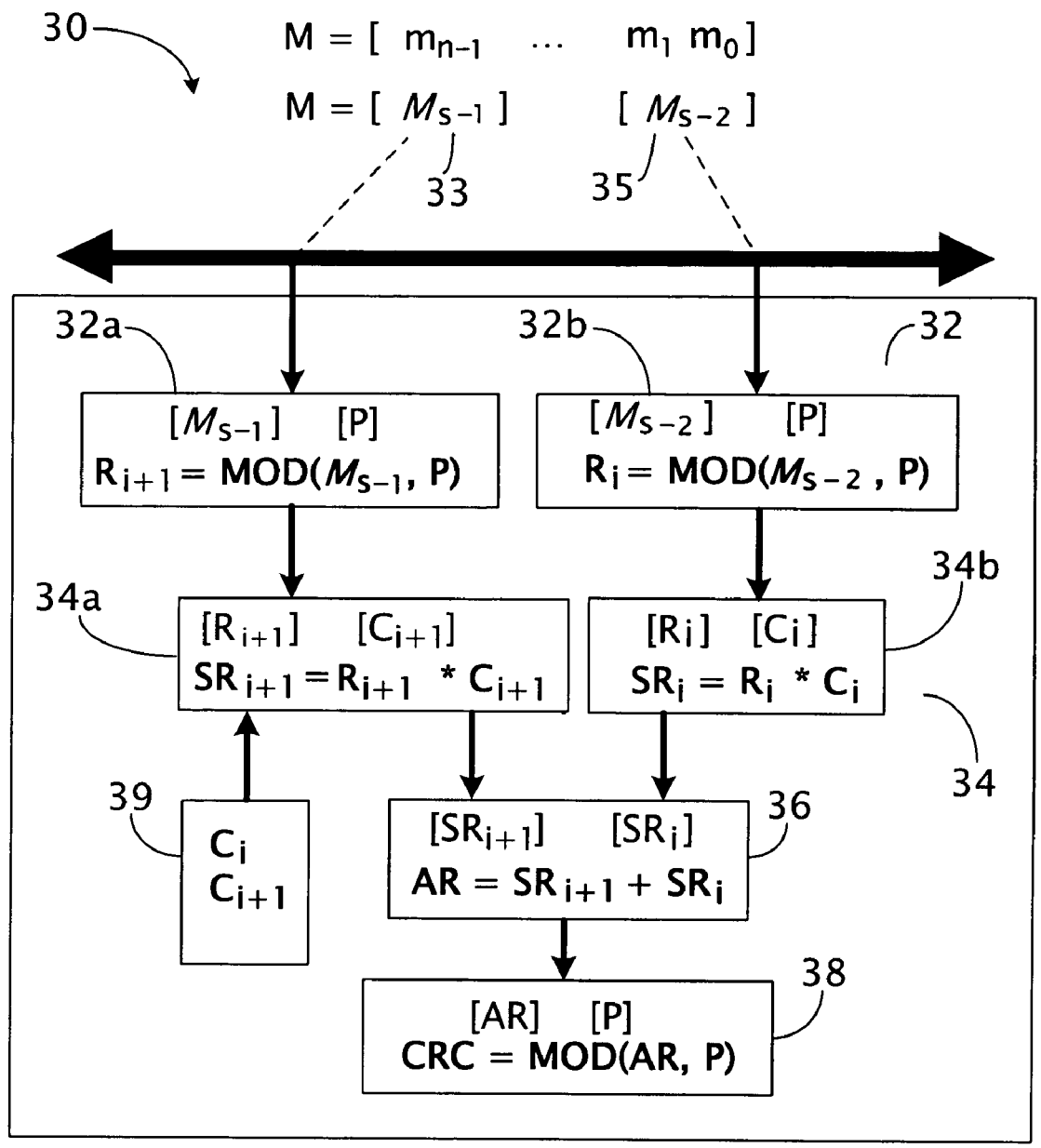
FIG. 3 shows a CRC generator for obtaining a CRC of a message according to the process in FIG. 2.

FIG. 3 shows an implementation of process 20 for calculating a CRC of message M based on generator polynomial P. For example:

if
   M=10111000, (Message 10111 with with 3 zero-bits appended)
   s=2,
   n=4, and
   P=1001=(Deg(P)=3);
then M may be separated as
   $M_{s-1} = M_1 = 1011$ = segment 33,
   $X^{n*(s-1)} = X^4 = 10000$,
   $M_{s-2} = M_0 = 1000$ = segment 35,
   $X^{n*(s-2)} = X^0 = 00001$;
where
   M=1011*10000+1000*00001=10111000.

CRC generator 30 obtains a CRC for message M based on generator polynomial P, where the CRC for message M is the remainder of message M divided by polynomial P (i.e., CRC=M(modulo)P=MOD(M, P).

Typically, generator polynomials P are selected because they are irreducible (i.e., they have no factors). Several examples of well-known generator polynomials include:

$$LRCC8 = X^8 + 1$$
$$= 100000001;$$
$$CRC16 = x^{16} + x^{15} + X^2 + 1$$
$$= 11000000000000 101;$$
$$SDLC = x^{16} + x^{12} + X^5 + 1$$
$$= 1000100000010000 1;$$
$$LRCC = x^{16} + 1$$
$$= 1000000000000000 1;$$
$$CRC12 = x^{12} + x^{11} + X^3 + X^2 + X + 1$$
$$= 1100000001111; \text{ and}$$
$$ETHERNET = x^{32} + x^{26} + X^{23} + X^{22} + x^{16} + x^{11} + X^{10} + X^8 + x^7 + X^5 + X^4 + X^2 + X + 1$$
$$= 100000100110000010000110110110111;$$

where LRCC stands for Last Registration Control Channel.

CRC generator 30 includes modulo unit 32, multiplier 34, accumulator 36, and modulo unit 38. Here, modulo unit 32 has modulo units 32a and 32b implemented in hardware.

Modulo unit 32a divides message segment 33 by generator polynomial P to obtain remainder $R_{i+1}$ (i.e., $R_{i+1}=M_{s-1}$(modulo)P=MOD($M_{s-1}$, P)). Modulo unit 32b divides message segment 35 by generator polynomial P to obtain remainder $R_i$ (i.e., $R_i=M_{s-2}$(modulo)P=MOD($M_{s-2}$, P)). For example:

if
  M=10111000,
  $M_{s-1}=M_1=1011$=segment 33,
  $M_{s-2}=M_0=1000$=segment 35, and
  P=1001;
then $$R_{i+1} = R_1 = M_{s-1}(\text{modulo})P = \text{MOD}(M_{s-1}, P)$$
$$= 1011(\text{modulo})1001 = 010, \text{ and}$$
$$R_i = R_0 = M_{s-2}(\text{modulo})P = \text{MOD}(M_{s-2}, P)$$
$$1000(\text{mudulo})1001 = 001;$$

where

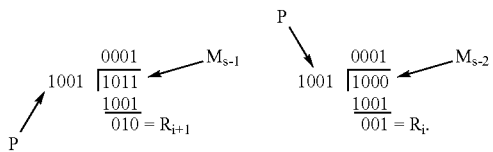

Multiplier 34 multiplies remainders $R_{i+1}$ and $R_i$ by segment-constants $C_{i+1}$ and $C_i$ to obtain segment-remainders $SR_{i+1}$ and $SR_i$. Here, segment-constants $C_{i+1}$ and $C_i$ are obtained by moduloing the position X of segments 33 and 35 in message M by generator polynomial P (i.e., $C_{i+1}=X^{n*(i+1)}$(modulo)P and $C_i=X^{n*i}$(modulo)P). For example:
if
  M=10111000,
  P=1001,
  s=2, and
  n=4;
then for $$SR_{i+1} = SR_1$$
$$C_{i+1} = C_1 = X^{4*1}(\text{modulo})P$$
$$= 10000(\text{modulo})1001 = 010, \text{ and}$$
$$SR_i = SR_0$$
$$C_i = C_0 = X^{4*0}(\text{modulo})P$$
$$= 0001(\text{modulo})1001 = 001;$$

where

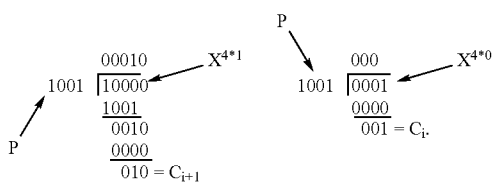

Segment-constants $C_{i+1}$ and $C_i$ may be obtained in advance, based on a known segmentation of message M and stored in memory unit 39, which is accessible to CRC generator 30. In other embodiments, segment-constants $C_{i+1}$ and $C_i$ may be obtained 'on the fly' within CRC generator 30 upon receipt of message M.

Multiplier 34 includes multipliers 34a and 34b. Multiplier 34a multiplies remainder $R_{i+1}$ by segment-constant $C_{i+1}$ to obtain segment-remainder $SR_{i+1}$. Multiplier 34b multiplies remainder $R_i$ by segment constant $C_i$ to obtain segment-remainder $SR_i$. For example:
if
  $R_{i+1}$=010, $C_{i+1}$=010 and (from above)
  $R_i$=001, $C_i$=001;
then
  $SR_{i+1}=R_{i+1}*C_{i+1}$=010*010=00100, and
  $SR_i=R_i*C_i$=001*001=00001;
where

```
    010              001
  * 010            * 001
  +000             +001
  +010             +000
  +000             +000
  00100 = SR_{i+1}   00001 = SR_i.
```

Accumulator 36 adds segment-remainders $SR_{i+1}$ and $SR_i$ together to obtain accumulated-remainder AR. For example:
if
  $SR_{i+1}=SR_1$=00100, (from above)
  $SR_i=SR_0$=00001;
then
  AR=00100+00001=00101,
where

```
   00100
  +00001
   00101 = AR.
```

Modulo unit 38 obtains the CRC for message M by moduloing accumulated-remainder AR by generator polynomial P (i.e., CRC=AR(modulo)P=MOD(AR, P)). For example:
if
  AR=00101, and (from above)
  P=1001;
then $$CRC = AR(\text{modulo})P = \text{MOD}(AR, P)$$
$$= 00101(\text{modulo})1001 = 101,$$

where

```
         00000  ← AR
    1001 |00101
          00000
           101 = CRC.
```

Hence, process 20 implemented on CRC generator 30 obtains the same CRC for message M, here 10111000. In this example, moduloing AR by polynomial P is not needed since the degree of AR was less than the degree of P.

Figure 4:
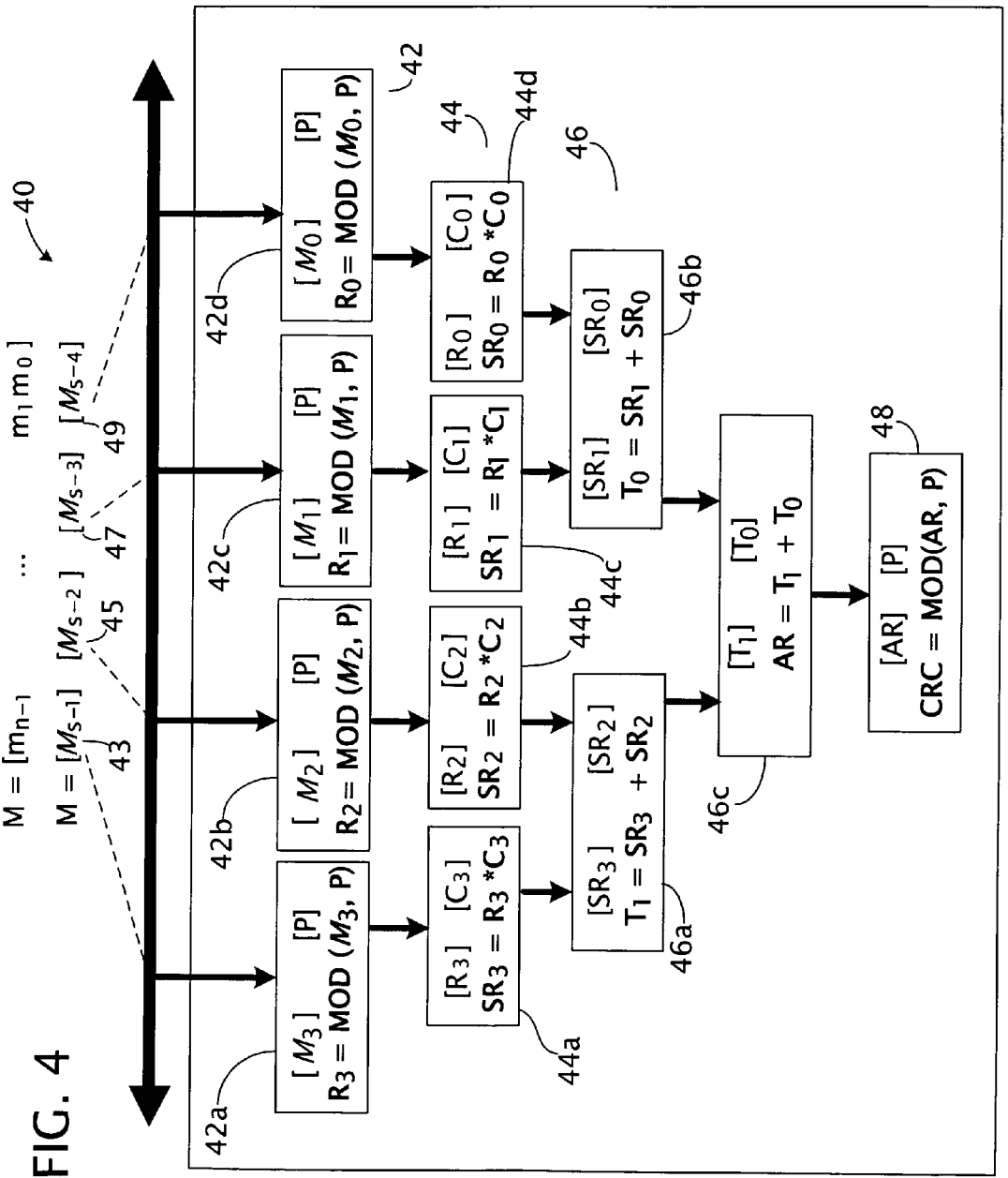
FIG. 4 shows the CRC generator of FIG. 3 separated into four segments.

CRC generator 30 may be expanded to include enough components for obtaining the CRC for message M separated into N segments. FIG. 4 shows CRC generator 40 capable of operating on message M separated into four (4) segments 43, 45, 47 and 49. For example:
if
M=M'=10111101, (e.g., message M in the example for FIG. 3 above having the obtained CRC appended to it)
s=4,
n=2, and
p=2;
then M may be separated as
$M_{s-1}=M_3=10=$segment 43,
$X^{n*(s-1)}=X^6=1000000$,
$M_{s-2}=M_2=11=$segment 45,
$X^{n*(s-2)}=X^4=10000$,
$M_{s-3}=M_1=11=$segment 47,
$X^{n*(s-3)}=X^2=100$,
$M_{s-4}=M_0=01=$segment 49,
$X^{n*(s-4)}=X^0=001$;
where
M=10*1000000+11*10000+11*100+01*001=10111101.

CRC generator 40 includes modulo unit 42, multipliers 44, accumulator 46, and modulo unit 48. Modulo unit 42 includes modulo units 42a, 42b, 42c and 42d. Modulo units 42a, 42b, 42c and 42d each operate to divide message segment 43, 45, 47 and 49 by generator polynomial P to obtain remainders $R_3$, $R_2$, $R_1$ and $R_0$. For example:
if
M=10111101=M', (from above)
$M_{s-1}=M_3=10=$segment 43,
$M_{s-2}=M_2=11=$segment 45,
$M_{s-3}=M_1=11=$segment 47,
$M_{s-4}=M_0=01=$segment 49, and
P=1001;
then $$R_{i+3} = R_3 = M_{s-1}(modulo)P = 10(modulo)1001$$
$$= 10,$$
$$R_{i+2} = R_2 = M_{s-2}(modulo)P = 11(modulo)1001$$
$$= 11,$$
$$R_{i+1} = R_1 = M_{s-3}(modulo)P = 11(modulo)1001$$
$$= 11, \text{ and}$$
$$R_i = R_0 = M_{s-4}(modulo)P = 01(modulo)1001$$
$$= 01.$$

Multiplier 44 multiplies remainders $R_3$ to $R_0$ by segment-constants $C_3$ to $C_0$ to obtain segment-remainders $SR_3$ to $SR_0$. Segment-constants $C_3$ to $C_0$ correspond to each particular segment 43, 45, 47 and 49 and may be obtained by moduloing the position of segments in message M by polynomial P. (i.e., $C_3=X^{n*(3)}(modulo)P$, $C_2=X^{n*2}(modulo)P$, $C_1=X^{n*1}(modulo)P$, $C_0=X^{n*0}(modulo)P$). For example:
if
M=10111101, (from above)
P=1001,
s=4, and
n=2;
then $$SR_3 = SR_{i+3}$$
$$C_3 = C_{i+3} = X^{2*3}(modulo)P$$
$$= 1000000(modulo)1001 = 001;$$
$$SR_2 = SR_0$$
$$C_2 = C_{i+2} = X^{2*2}(modulo)P$$
$$= 10000(modulo)1001 = 010;$$
$$SR_1 = SR_1$$
$$C_1 = C_{i+1} = X^{2*1}(modulo)P$$
$$= 100(modulo)1001 = 100; \text{ and}$$
$$SR_0 = SR_i$$
$$C_0 = C_{i+0} = X^{4*0}(modulo)P$$
$$= 001(modulo)1001 = 001.$$

Segment constants $C_3$ to $C_0$ may be obtained in advance based on the segmentation of message M and stored in a memory unit 39 (FIG. 3) accessible to CRC generator 40. In other embodiments $C_3$ to $C_0$ may be obtained 'on the fly' (i.e., in real-time)within CRC generator 40 as it receives message M.

Multiplier 44 multiplies $R_3$ by $C_3$, $R_2$ by $C_2$, $R_1$ by $C_1$, and $R_0$ by $C_0$ to obtain segment-remainders $SR_3$ to $SR_0$. For example:
if
$R_{i+3}=R_3=10$, $C_{i+3}=C_3=001$; (from above)
$R_{i+2}=R_2=11$, $C_{i+2}=C_2=010$;
$R_{i+1}=R_1=11$, $C_{i+1}=C_1=100$; and
$R_{i=R0}=01$, $C_i=C_{i0}=001$;
then
$SR_3=R_3*C_3=10*001=0010$;
$SR_2=R_2*C_2=11*010=0110$;
$SR_1=R_1*C_1=11*100=1100$; and
$SR_0=R_0*C_0=01*001=0001$.

Accumulator 46 adds segment-remainders $SR_3$ to $SR_0$ together to obtain accumulated-remainder AR. Here, accumulator 46 includes accumulators 46a, 46b and 46c, where accumulators 46a and 46b compute temporary accumulations $T_1$ and $T_0$ and accumulator 46c combines temporary accumulations $T_1$ and $T_0$ to obtain accumulated-remainder AR. For example:
if
$SR_{i+3}=SR_3=0010$, (from above)
$SR_{i+2}=SR_2=0110$,
$SR_{i+1}=SR_1=1100$, and
$SR_i=SR_0=0001$;
then
$T_1=0010+0110=0100$,
$T_0=1100+0001=1101$, and
AR=0100+1101=1001.

Finally, modulo unit 48 obtains the CRC for message M, here message M' having the CRC obtained as described in FIG. 3 above, by moduloing accumulated-remainder AR by polynomial P (i.e., CRC=AR(modulo)P=MOD(AR, P). For example:
if
AR=1001, and (from above)
P=1001;
then
CRC=AR(modulo)P=1001(modulo)1001=0 where

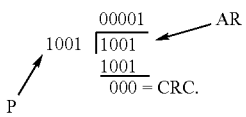

Thus, CRC generator 40 verifies the integrity of message M from the example in FIG. 3 where the CRC of message M was appended to form M' and transmitted to a receiver 14 who confirmed the transmission using CRC generator 40 (FIG. 4).

According to process 20, CRC generators 30 and 40 may be further simplified where the degree of message segments $M_s$ are less than the degree of generator polynomial P (i.e., $\text{Deg}(M_s)<\text{Deg}(P)$). As shown in the example for FIG. 4 above, the remainder R of $M_s(\text{modulo})P$ equals $M_s$ when the degree of $M_s$ is less than the degree of P. Thus, CRC generator 50 (FIG. 5) does not need an initial modulo unit (e.g., 32 or 42) for obtaining a remainder $R_i$ of message segments $M_s$ that are of a degree less than the degree of generator polynomial P. For segments of degree equal to P (i.e., $\text{Deg}(M_s)=\text{Deg}(P)$) modulo units 32 or 42 may be replaced by an xor, as $M_s(\text{modulo})P$ equals $M_s-P$.

Here, CRC generator 50 includes multiplier 54, accumulator 56, and modulo unit 58, which operate to obtain a CRC for message M separated into four segments 53, 55, 57 and 59 of a degree less than the degree of generator polynomial P (i.e., $\text{Deg}(M_s)<\text{Deg}(P)$). For example:
if
   M=10111000, (M including 3 appended zero bits as in FIG. 3 above)
   s=4,
   n=2, and
   P=1001;
then
   $M_{s-1}=M_3=10=$segment 53,
   $X^{n*(s-1)}=X^6=1000000$,
   $M_{s-2}=M_2=11=$segment 55,
   $X^{n*(s-2)}=X^4=10000$,
   $M_{s-3}=M_1=10=$segment 57,
   $X^{n*(s-3)}=X^2=100$,
   $M_{s-4}=M_0=00=$segment 59,
   $X^{n*(s-4)}=X^0=001$;
and $$M = 10*1000000 + 11*10000 + 10*100 + 00*001 = 10111000.$$

Multiplier 54 multiplies segments 53 to 59 by segment-constants $C_3$ to $C_0$ to obtain segment-remainders $SR_3$ to $SR_0$. Segment-constants $C_3$ to $C_0$ may be obtained in advance or calculated 'on the fly' as described above. For example:
if
   M=10111000, (from above)
   P=1001,
   s=4, and
   n=2;
then $$SR_3 = SR_{i+3}$$
$$C_3 = C_{i+3} = X^{2*3}(\text{modulo})P$$
$$= 1000000(\text{modulo})1001 = 001;$$

-continued $$SR_2 = SR_{i+2}$$
$$C_2 = C_{i+2} = X^{2*2}(\text{modulo})P$$
$$= 10000(\text{modulo})1001 = 010;$$
$$SR_1 = SR_{i+1}$$
$$C_1 = C_{i+1} = X^{2*1}(\text{modulo})P$$
$$= 100(\text{modulo})1001 = 100; \text{ and}$$
$$SR_0 = SR_i$$
$$C_0 = C_{i+0} = X^{4*0}(\text{modulo})P$$
$$= 001(\text{modulo})1001 = 001.$$

Multiplier 54 multiplies $M_3$ by $C_3$, $M_2$ by $C_2$, $M_1$ by $C_1$, and $M_0$ by $C_0$ to obtain segment-remainders $SR_3$ to $SR_0$, since each message segment $M_s$ equals its remainder R. For example:
if
   $M_{s-1}=M_3=10$, $C_{i+3}=C_3=001$,
   $M_{s-2}=M_2=11$, $C_{i+2}=C_2=010$,
   $M_{s-3}=M_1=10$, $C_{i+1}=C_1=100$, and
   $M_{s-4}=M_0=00$, $C_i=C_{i0}=001$;
then
   $SR_3=M_3*C_3=10*001=0010$,
   $SR_2=M_2*C_2=11*010=0110$,
   $SR_1=M_1*C_1=10*100=1000$, and
   $SR_0=M_0*C_0=00*001=0000$.

Accumulator 56 adds segment-remainders $SR_3$ to $SR_0$ together to obtain accumulated-remainder AR. Here, accumulator 56 includes accumulators 56a, 56b and 56c, where accumulators 56a and 56b compute temporary accumulations $T_1$ and $T_0$ and accumulator 56c combines temporary accumulations $T_1$ and $T_0$ to obtain accumulated-remainder AR. For example:
if
   $SR_{i+3}=SR_3=0010$, (from above)
   $SR_{i+2}=SR_2=0110$,
   $SR_{i+1}=SR_1=1000$, and
   $SR_i=SR_00000$;
then
   $T_1=0010+0110=0100$;
   $T_0=1000+0000=1000$; and
   AR=0100+1000=1100.

Finally, modulo unit 58 obtains a CRC for message M by moduloing accumulated-remainder AR by polynomial P. For example:
if
   AR=1100, and (from above)
   P=1001;
then
   CRC=AR(modulo)P=1100(modulo)1001=101;
where

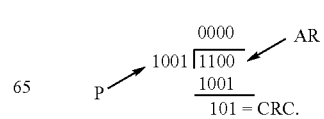

Thus, CRC generator 50 obtains the same CRC for message M as calculated in the example in FIG. 3 above without needing modulo units 32 or 42 of FIGS. 3 and 4.

Moduloing (e.g., (203) and (209)) may also be accomplished by multiplying message M (or message segment $M_s$) by a reciprocal approximation D of generator polynomial P and subtracting that result from message M (or message segment $M_s$) to obtain a remainder R. Moduloing by multiplication by reciprocal approximator RA may be obtained based upon the following relationships:

$RA = X^{p+d}/P$;
$M/P = M*RA*1/X^{p+ra}$ (for 0<=Deg(M)<=p+ra);
$M = (M/P)*P + M(modulo)P$;
$R = M(modulo)P = M - (M/P)*P$;
$R = M(modulo)P = M - (M*D/X^{p+ra})*P$ where $X^{p+ra}$ is a polynomial having a most significant bit of degree p+ra (i.e. $Deg(X^{p+ra})=p+ra$); p is the degree of generator polynomial P (i.e., Deg(P)=p); ra is the degree of reciprocal-approximator RA (i.e., Deg(RA)=ra); and the degree of message M, for which remainder R is sought, is greater than zero and less than or equal to p+ra (i.e., 0<Deg(M)<=p+ra). For example:
if
M=10111000 (i.e., Deg(M)=7), and
P=1001 (i.e., Deg(P)=3).

then reciprocal-approximator RA would have a degree of at least four (4) for p+ra to be greater than or equal to the degree of M, here seven (7). Thus:
if
M=10111000 (i.e., Deg(M)=7),
P=1001 (i.e., Deg(P)=3); and;
ra=4;
then $X^{p+ra} = 10000000$ (i.e., $Deg(X^{p+ra}) = 7$), and $D = X^{p+ra}/P = X^{3+4}/1001$
$= 10000000/1001 = 10010$;

where

```
              00010010  ← RA
      1001 ⟌ 10000000
              1001                  ← X^{p+ra}
P              0010
               0000
                0100
                0000
                 1000
                 1001
                  0010
                  0000
                   010
```

Modulo unit 60 may calculate reciprocal-approximator RA prior to receiving message M and store RA in memory 69 since both generator polynomial P and the degree of message M are known prior to receiving message M. In other embodiments, reciprocal-approximator RA may be built in or obtained 'on-the fly' by modulo unit 60 after receiving message M. Once the form of the polynomial is fixed, the implementation of the corresponding hardware may be simplified considerably.

To obtain remainder R for message M modulo unit 60 includes multiplication unit 62, truncation unit 64, multiplication unit 66 and subtraction unit 68 where:
$T_0 = M*RA$ is performed by unit 62,
$T_1 = T_0/X^{p+ra}$ is performed by unit 64,
$T_2 = T_1*P$ is performed by unit 66, and
$R = M - T_2$ is performed by unit 68.

Multiplication unit 62 receives message M and multiplies M by reciprocal-approximator RA to obtain temporary result $T_0$. For example:
if
M=10111000, (from FIG. 3 above)
P=1001, and
RA=10010;
then $T_0 = M * RA = 10111000 * 10010 = 101011110000$;

where

```
   10111000   ← M
*     10010   ← RA
   00000000
   10111000
  00000000
 00000000
10111000
101011110000   ↙ T_0.
```

Multiplication unit 62 provides temporary result $T_0$ to truncation unit 64, which divides $T_0$ by $X^{p+ra}$, here 10000000, to obtain truncated result $T_1$. In other embodiments, truncation unit 64 may remove the p+ra least significant bits of temporary result $T_0$ without dividing by $X^{p+ra}$ to obtain truncated result $T_1$. For example:
if
P=3,
ra=4, and
$T_0$=101011110000;
then
p+ra=7, and
$T_1$=10101.

Thus for p+ra equaling seven (7), the seven (7) least significant bits, here 1110000, are removed from $T_0$ to obtain $T_1$.

Truncation unit 64 provides truncated result $T_1$ to multiplication unit 66, which multiplies $T_1$ by generator polynomial P to obtain temporary result $T_2$. For example;
if
P=1001, and
$T_1$=10101;
then
$T_2 = T_1*P = 10101*1001$
$= 10111101$
where

```
  10101   ← T_1
* 1001    ← P
  10101
 00000
00000
10101
10111101   ↙ T_2.
```

Multiplication unit 66 provides temporary result $T_2$ to subtraction unit 68, which subtracts $T_2$ from message M to obtain remainder R. For example:

if
   M=10111000, and (from above)
   $T_2$=10111101;
then
   R=M−$T_2$=101
where

```
            M
  10111000  T2
- 10111101  R.
  00000101
```

Thus, modulo unit 60 obtains remainder R for message M using multiplication by reciprocal approximation. Hence, modulo unit 60 may calculate the CRC for the entire message M on its own, or may be incorporated into CRC generators 30 and 40 to obtain remainders R for message segments $M_s$.

Figure 6:
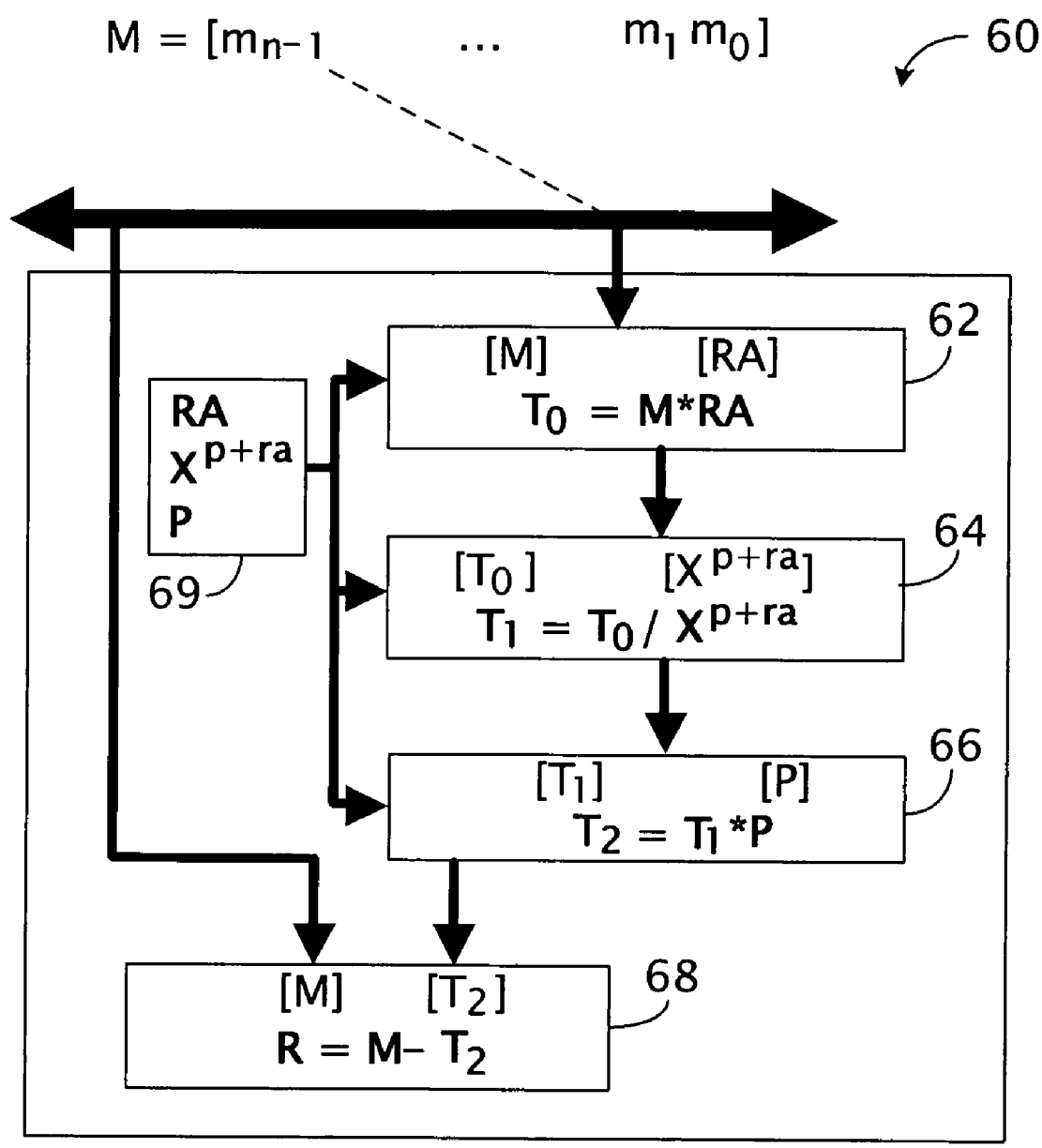
FIG. 6 shows a modulo unit for obtaining a remainder of a message using a reciprocal approximation of a generator polynomial.
Figure 7:
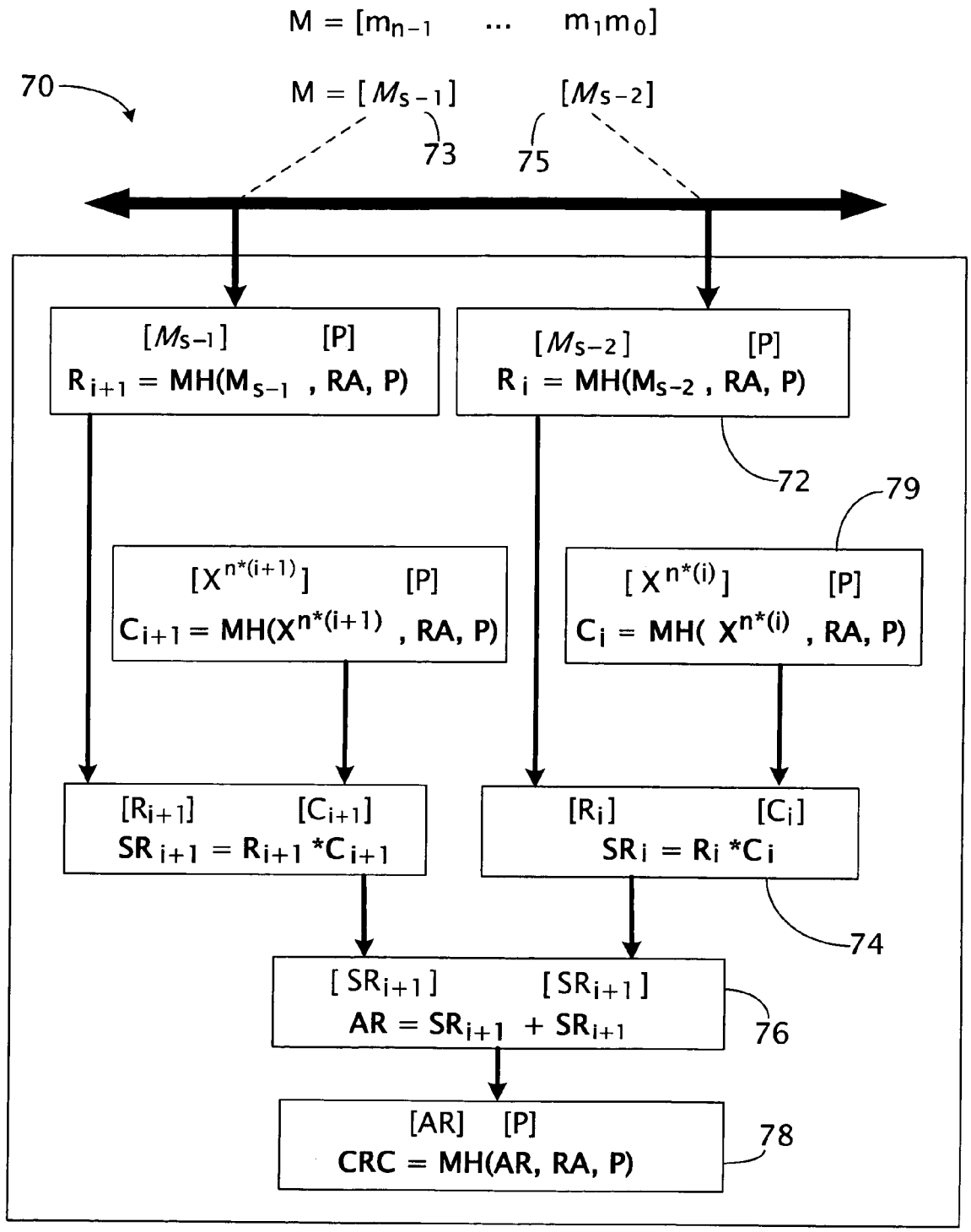
FIG. 7 shows the CRC generator in FIG. 3 using the modulo unit in FIG. 6.

For example, FIG. 7 shows an implementation of the CRC generator in FIG. 3 employing modulo unit 60 in FIG. 6. Here, modulo units 60 are show as MH (M, RA, P). For example:

if
   M=10111000, (Same as in FIG. 3 above)
   s=2,
   n=4, and
   P=1001;
then M may be separated as
   $M_{s-1}=M_1$=1011=segment 73
   $X^{n*(s-1)}=X^4$=10000,
   $M_{s-2}=M_0$=1000=segment 75
   $X^{n*(s-2)}=X^0$=00001;
where
   M=1011*10000+1000*00001=10111000.

CRC generator 70 obtains a CRC for message M based on generator polynomial P, where the CRC for message M is the remainder of message M divided by polynomial P.

CRC generator 70 includes modulo unit 72, multiplier 74, accumulator 76, and modulo unit 78. Here, modulo unit 72 includes modulo units 72a and 72b, which multiply message segments 73 and 75 by a reciprocal approximation of generator polynomial P to obtain remainders $R_{i+1}$ and $R_i$.

Modulo unit 72a multiplies message segment 73 by reciprocal-approximator RA of generator polynomial P to obtain a remainder R as shown in FIG. 6. For example:

if
   M=10111000,
   $M_{s-1}=M_1$=1011=segment 73,
   $M_{s-2}=M_0$=1000=segment 75,
   Deg($M_{s-1}$)=3
   Deg($M_{s-2}$)=3
   P=1001, and
   RA=$X^{p+ra}/P=X^{3+1}/P$, so that p+ra is greater than or equal to the degree of each message segment $M_{s-1}$ and $M_{s-2}$;
then
   RA=$X^{3+1}/P$=10000/1001=10;

where

```
         00010 ← RA
    1001 |10000
         1001     X^3+1
  P /    0000
         0000
          010;
``` and
   $T_{0(i+1)}=M_{s-1}*RA=1011*10=10110$,
   $T_{0(i)}=M_{s-2}*RA=1000*10=10000$,
   $T_{1(i+1)}=T_{0(i+1)}/X^{3+1}=10110/10000=1$,
   $T_{1(i)}=T_{0(i)}/X^{3+1}=10000/10000=1$,
   $T_{2(i+1)}=T_{1(i+1)}*P=1*1001=1001$,
   $T_{2(i)}=T_{1(i)}*P=1*1001=1001$,
   $R_{i+1}=M_{s-1}-T_{2(i+1)}=1011-1001=010$
   $R_i=M_{s-2}-T_{2(i)}=1000-1001=001$.

Hence, modulo units 72a and 72b obtain the same remainders $R_{i+1}$ and $R_i$ as modulo units 32a and 32b in FIG. 3 above.

Multiplier 34 multiplies $R_{i+1}$ and $R_i$ by segment-constants $C_{i+1}$ and $C_i$ to obtain segment-remainders $SR_{i+1}$ and $SR_i$. Here, segment-constants $C_{i+1}$ and $C_i$ are obtained 'on the fly' by moduloing the position X of segments 33 and 35 in message M by generator polynomial P (i.e., $C_{i+1}=X^{n*(i+1)}$(modulo)P and $C_i=X^{n*i}$(modulo)P) using modulo unit 60 described in FIG. 6. For example:

if
   $X^{n*(i+1)}=X^{4*(1)}=M_1$=10000,
   $X^{n*i}=X^{4*(0)}=M_0$=00001,
   Deg($X^{4*(1)}$)=4,
   Deg($X^{4*(0)}$)=0,
   P=1001, and
   RA=$X^{p+ra}/P=X^{3+1}/P$, so that p+ra is greater than or equal to the degree of each message segment $X^{4*(1)}$ and $X^{4*(0)}$;
then
   RA=10000/1001=10;
and
   $T_{0(i+1)}=M_1*RA=10000*10=100000$,
   $T_{0(i)}=M_0*RA=00001*10=000010$,
   $T_{1(i+1)}=T_{0(i+1)}/X^{3+1}=100000/10000=10$,
   $T_{1(i)}=T_{0(i)}/X^{3+1}=000010/10000=0$,
   $T_{2(i+1)}=T_{1(i+1)}*P=10*1001=10010$,
   $T_{2(i)}=T_{1(i)}*P=0*1001=00000$,
   $C_{i+1}=M_1-T_{2\ (i+1)}=10000-10010=010$,
   $C_{i=M0}-T_{2(i)}=00001-00000=001$.

In other embodiments segment-constants $C_{i+1}$ and $C_i$ may be obtained in advance in stored in a memory unit (e.g. 39).

Multiplier 74 includes multipliers 74a and 74b. Multiplier 74a multiplies remainder $R_{i+1}$ by segment-constant $C_{i+1}$ to obtain segment-remainder $SR_{i+1}$. Multiplier 74b multiplies $R_i$ by segment constant $C_i$ to obtain segment-remainder $SR_i$. For example:

if
   $R_{i+1}$=010, $C_{i+1}$=010 and (from above)
   $R_i$=001, $C_i$=001;
then
   $SR_{i+1}=R_{i+1}*C_{i+1}=010*010=00100$, and
   $SR_i=R_i*C_i=001*001=00001$;

Accumulator 76 adds segment-remainders $SR_{i+1}$ and $SR_i$ together to obtain accumulated-remainder AR. For example:

if
   $SR_{i+1}=SR_1$=00100,
   $SR_i=SR_0$=00001;
then
   AR=00100+00001=00101.

Modulo unit 78 obtains a CRC for message M by moduloing accumulated-remainder AR by generator polynomial P. Here, modulo unit 78 obtains the CRC by using multiplication by reciprocal approximation shown in FIG. 6. For example:

if
   AR=M=00101,
   Deg(AR)=2
   P=1001, and
   RA=$X^{p+ra}/P=X^{3+1}/P$ so that p+ra is greater than or equal to the degree of the message for which a remainder is desired, here AR;
then
   RA=10000/1001=10;
and
   $T_0$=M*RA=00101*10=1010,
   $T_1=T_0/X^{3+1}$=1010/10000=0,
   $T_2=T_1$*P=0*1001=0,
   R=CRC=M-$T_2$=00101-0=101.

Thus CRC generator 70 obtains the same CRC the example for CRC generator 30. Likewise, CRC generator 70 may also be expanded to include enough components for obtaining the CRC for message M separated into N segments.

Figure 8:
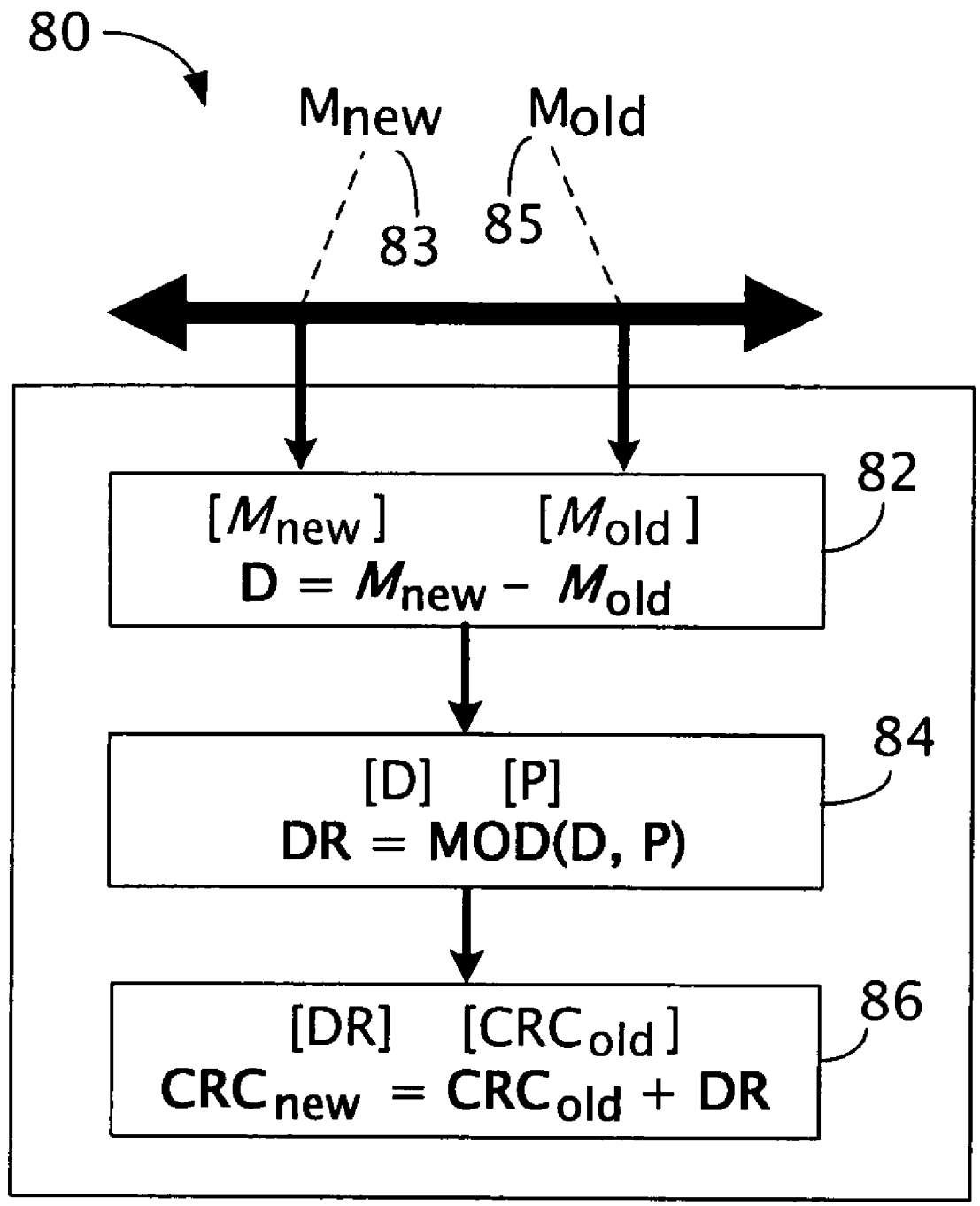
FIG. 8 shows a CRC generator for updating a CRC of a message M where a portion of message M has been adjusted.

CRC generator 80 (FIG. 8) includes subtraction unit 82, modulo unit 84 and accumulator 86 for updating a CRC of a message M adjusted during transmission. Subtraction unit 82 subtracts old message 83 from new message 85 to obtain difference D. For example:

if
   P = 1001,    ← $CRC_{old}$
   $M_{old}$ = 10111|101
   $M_{new}$ = 10001|101   ← CRC to be updated then
   D=$M_{new}-M_{old}$=00110000
wherein adjusted portion of M
   10 | 11 | 1101 ← $M_{new}$
 - 10 | 00 | 1101 ← $M_{old}$
   00 | 11 | 0000 = D.

Modulo unit 84 modulos difference D by generator polynomial P to obtain a difference-remainder DR. For example:

if
   P=1001, and
   D=00110000;
then
   DR=D(modulo)P=MOD(D, P)=
wherein

```
              00000110
P →  1001 | 00110000  ← D
              0000
              0110
              0000
              1100
              1001
              1010
              1001
              0110
              0000
              110 = DR.
```

In other embodiments, difference-remainder DR may be obtained using multiplication by reciprocal-approximator RA (i.e. MH (D, RA, P)).

Accumulator 86 adds difference-remainder DR and $CRC_{old}$ to obtain a $CRC_{new}$. For example:

if
   $CRC_{old}$=101 and
   DR=110;
then $$CRC_{new} = CRC_{old} + DR = 101 + 110$$
$$= 011;$$

where if
   P = 1001,      ← $CRC_{new}$
   $M_{new}$ = 10001|011;

then
   $M_{new}$ (modulo) $CRC_{new}$ = 0 wherein

```
              00010011
         1001 | 10001011
                1001
                 0011
                 0000
                  0110
                  0000
                   1101
                   1001
                    1001
                    1001
                     000 = CRC.
```

The accuracy of this $CRC_{new}$ may be confirmed by replacing $CRC_{old}$ in the adjusted message $M_{new}$ with $CRC_{new}$ and determining whether $M_{new}$(modulo)$CRC_{new}$ equals zero. For example:

101
   +110
   011 = $CRC_{new}$.

Figure 9:
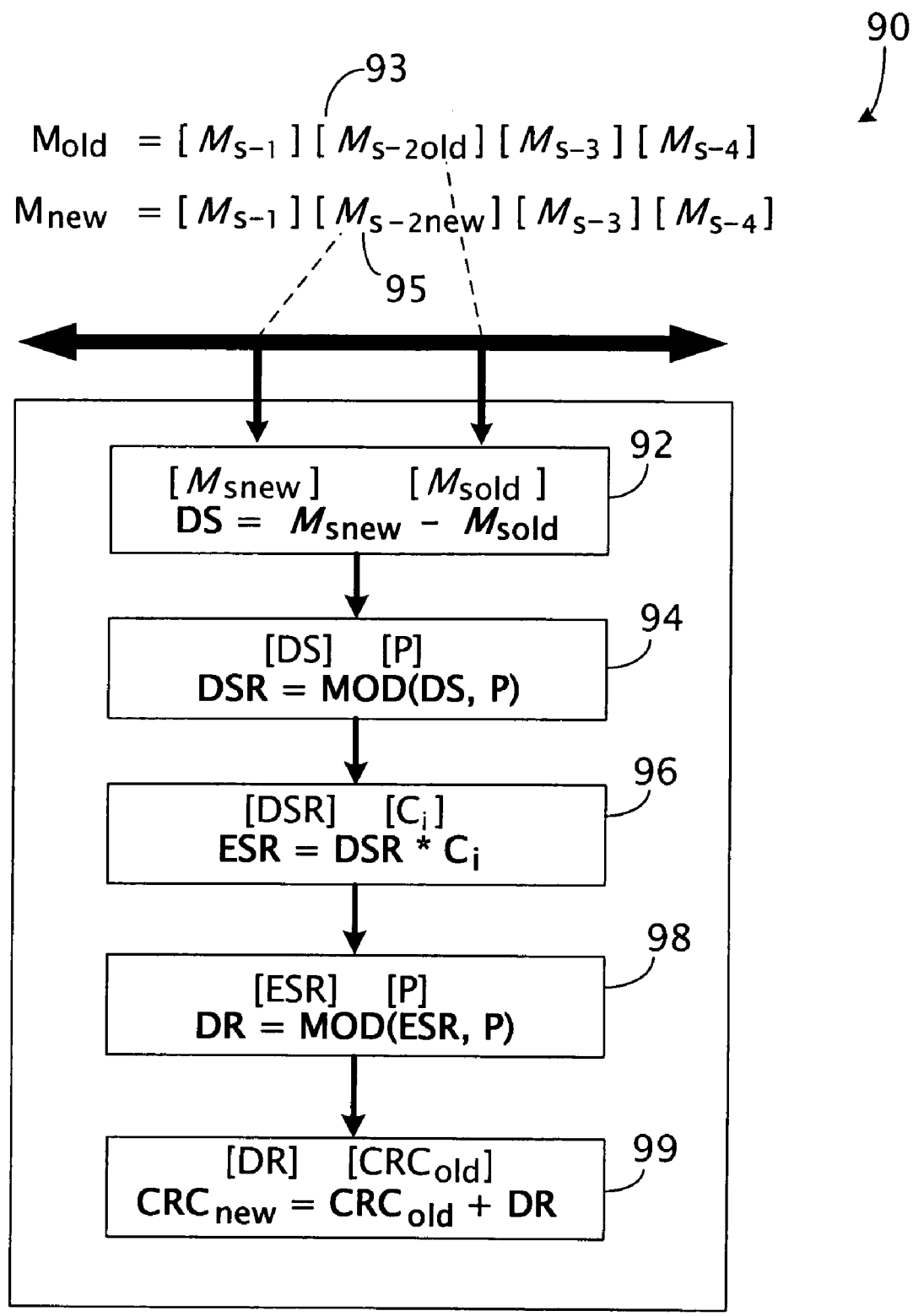
FIG. 9 shows the CRC generator in FIG. 8 operating on an adjusted segment of message M.

CRC generator 90 (FIG. 9) includes subtraction unit 92, modulo unit 94, multiplier 96, modulo unit 98 and accumulator 99 for updating a CRC of a message M adjusted during transmission. CRC generator 90 differs from generator 80 in that it adjusts the CRC of a message M based on the adjusted segment of the message.

Subtraction unit 92 subtracts old message segment 93 from new message segment 95 to obtain difference-segment DS. For example:

if
   P=1001,
   n=2
   s=4

$M_{old} = 10111|101$
$M_{s-1} = 10$
$M_{s-2} = 11$ = segment 93 ⟵ $CRC_{old}$
$M_{s-3} = 11$
$M_{s-4} = 01$ $M_{new} = 10001|101$
$M_{s-1} = 10$
$M_{s-2} = 00$ = segment 95
$M_{s-3} = 11$
$M_{s-4} = 01$ then
   $DS = M_{s-2(new)} - M_{s-2(old)} = 00 - 11 = 11$.

Modulo unit 94 modulos difference-segment DS by generator polynomial P to obtain a difference-segment-remainder DSR. For example:
  if
    P=1001, and
    DS=11;
  then
    DSR=DS(modulo)P=MOD(DS, P)=11
  wherein $$P \longrightarrow 1001 \overline{\smash{)}\begin{array}{c}00\\11\\00\\\hline 11\end{array}} \longleftarrow DS$$

$= DSR$.

Here, as above, if the difference-segment DS is of a lesser degree than polynomial P, modulo unit 94 is not needed since the modulo of DS equals DS.

Multiplier 96 multiplies difference-segment-remainder DSR by an appropriate segment-constant $C_i$ to obtain an expanded segment-remainder ESR. Segment-constants $C_3$ to $C_0$ for this example may be obtained as described above. For example:
  if
    $DSR = (M_{2new} - M_{2old})(modulo)P = 11$
  and $$C_i = C_2 = X^{2*2}(modulo)P$$
$$= 10000(modulo)1001 = 010;$$

then
    $EDR = DSR * C_i = 11 * 010 = 110$.

Modulo unit 98 obtains message difference-remainder DR by moduloing the extended difference-remainder by generator polynomial P. For example:
  if
    P=1001 and
    EDR=110;
  then
    DR=110.

Again, for extended difference-remainders of a degree less than the degree of polynomial P the DR is the EDR.

Finally, accumulator 99 adds the message difference-remainder DR and $CRC_{old}$ to obtain a $CRC_{new}$. For example:
  if
    $CRC_{old}$=101 and
    DR=110;
then $$CRC_{new} = CRC_{old} + DR = 101 + 110$$
$$= 011;$$

wherein $$\begin{array}{r}101\\+\ 110\\\hline 011\end{array} = CRC_{new}.$$

Figure 5:
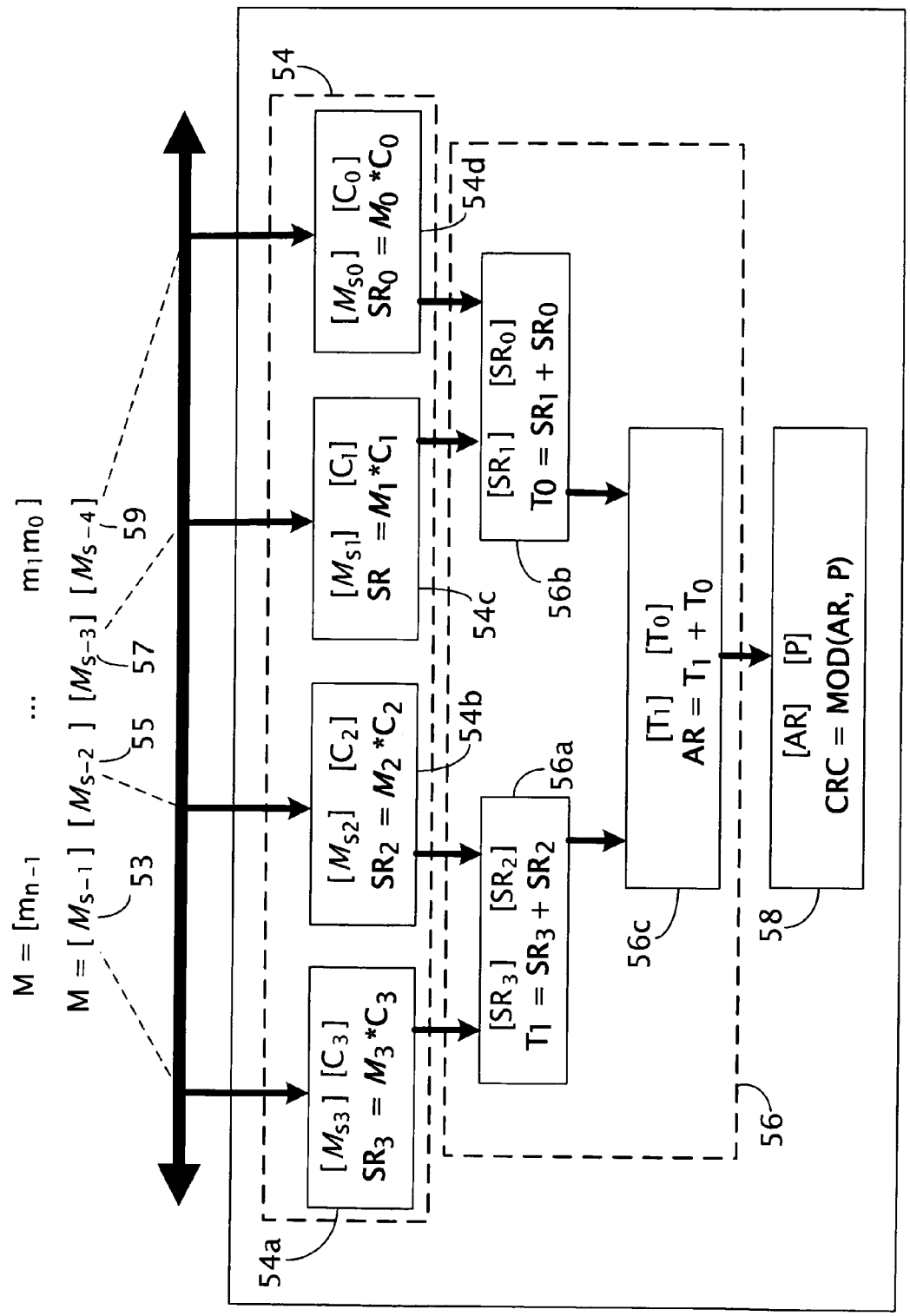
FIG. 5 shows a CRC generator for obtaining a CRC of a message M according to the process in FIG. 2.

All of the above algorithms may be affected by embedding generator polynomial P in a larger ring. For example, let $$F = P*Q;$$

where F is a field extension of P, Q is an extender, and the greatest common denominator between P and Q is one (1). Segment-constants C may now be calculated using field extension F, instead of p, and message segments Ms increased in size (by bit) accordingly without requiring the additional modulos 42 and 42 in FIGS. 3 and 4 above. Rather, only modulo by P, as shown in FIG. 5 may be needed.

Figure 10:
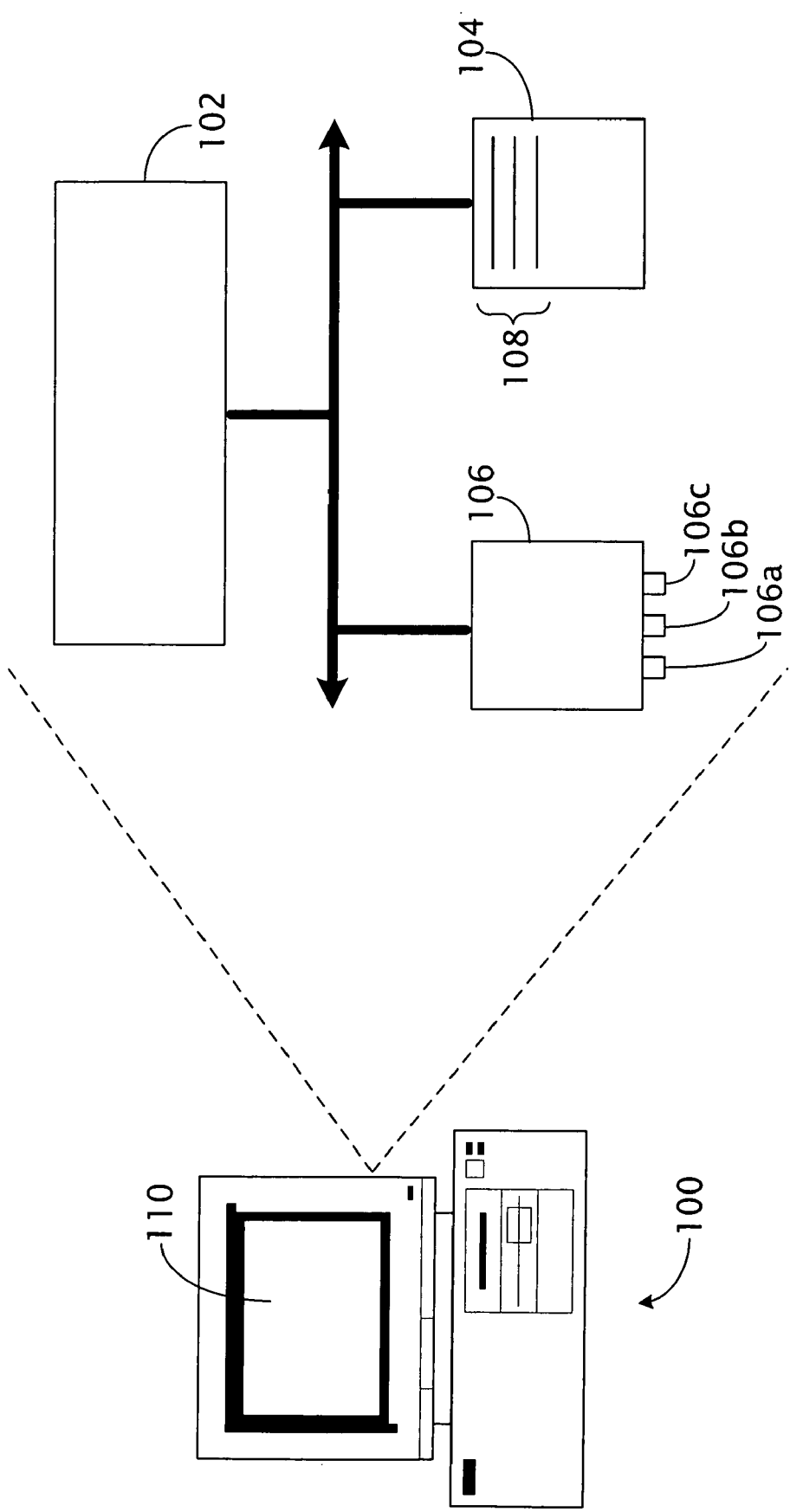
FIG. 10 is a view of computer hardware used to implement an embodiment of the invention.

FIG. 10 shows a general-purpose computer 100 for obtaining a CRC using process 20 or any of the operations of the CRC generator units 30, 40, 50, 60, 70, 80 and 90 shown above. Computer 100 includes a processor 102 (e.g. a CPU), a storage medium 104 (e.g., a random access memory) and communication interface 106 (e.g., a network card) having one or more external connections 106a, 106b and 106c for sending and receiving data transmissions. Storage medium 104 stores computer instructions 108 for obtaining a CRC via process 20 or the operations of the CRC generator units described above. In one embodiment, computer 100 obtains a CRC for a message M based on multiplication by reciprocal approximation.

Process 20 and the operations of the CRC generators shown above, however, are not limited to use with any particular hardware or software configuration; they may find compatibility in any computing or processing environment. Process 20 may be implemented in hardware, software, or any combination of the two. So too, may the operations of the CRC generator units 30, 40, 50, 60, 70, 80 and 90.

Process 20 and the CRC generators described above may be implemented in computer programs executing on programmable computers that each include a processor, a storage medium readable by the processor (e.g. volatile memory, non-volatile memory, etc.), one or more input devices, and one or more out devices. Program code may be applied to data entered using an input device to perform process 20 or any of the operations of the CRC generators described above. The output information may be applied to one or more output devices, such as screen 110.

Each such program may be implemented in a high level procedural or object-oriented programming language to communicate with a computer system. However, the programs can be implemented in assembly or machine language. The language may be a compiled or an interpreted language.

Each computer program may be stored on an article of manufacture, such as a CD-ROM, hard disk, or magnetic diskette, that is readable by computer 100 to obtain a CRC for message M in the manners described above. Process 20 and the operations for implementing the CRC generators above may also be implemented as a machine-readable storage medium, configured with one or more computer programs, where, upon execution, instructions in the computer program(s) cause the processor 102 to operate as described above.

A number of embodiments of the invention have been described. Nevertheless, it will be understood that various modifications may be made without departing from the spirit and scope of the invention. For example, message M may be divided into an odd number of segments or segment sizes or field extensions F may be substituted for generator polynomial P were appropriate. Accordingly, other embodiments are within the scope of the following claims.

What is claimed is:

1. A method for obtaining a cyclic redundancy code for a message, comprising:
   storing a reciprocal-approximator for a generator polynomial in a storage;
   separating the message into a plurality of segments;
   obtaining a remainder for each of the plurality of segments, including multiplying each segment by the stored reciprocal-approximator;
   multiplying the remainder for each segment by a segment-constant based on the generator polynomial to obtain a plurality of segment-remainders;
   accumulating the segment-remainders to obtain an accumulated-remainder; and
   obtaining the cyclic redundancy code for the message, including multiplying the accumulated-remainder by the stored reciprocal-approximator.

2. The method of claim 1, further comprising separating the message into three or more segments.

3. The method of claim 1, wherein the cyclic redundancy code is appended to the message and the appended message is transmitted to a receiver.

4. The method of claim 1, wherein cyclic redundancy code indicates the existence of an error in the message.

5. The method of claim 4, wherein integrity of the message is verified if the cyclic redundancy code is zero.

6. The method of claim 4, wherein the integrity of the message is invalidated if the cyclic redundancy code is non-zero.

7. The method of claim 1, wherein the reciprocal-approximator for the generator polynomial comprises $X^{p+ra}/P$, where P is the generator polynomial, p is the degree of the generator polynomial, and ra is the degree of the reciprocal-approximator.

8. The method of claim 1 wherein the segment-constant for each segment is obtained by moduloing the position of the segment in the message by the generator polynomial.

9. A device for obtaining a cyclic redundancy code for a message, the message separated into a plurality of segments, comprising:
   a storage to store a reciprocal-approximator for a generator polynomial;
   a modulo unit to obtain a remainder for each of the plurality of segments by performing computations that include multiplying each segment of the message by the stored reciprocal-approximator;
   a multiplier to multiply the remainder for each segment by a segment-constant based on the generator polynomial to obtain a plurality of segment-remainders; and
   an accumulator to accumulate the segment-remainders to obtain an accumulated-remainder;

wherein the modulo unit also obtains the cyclic redundancy code for the message by performing computations that include multiplying the accumulated-remainder by the stored reciprocal-approximator.

10. The device in claim 9, wherein the device is a network card.

11. The device in claim 9, further comprising a memory for storing a plurality of segment-constants.

12. The device in claim 9, wherein the segment-constant is obtained upon receipt of the message.

13. The device in claim 9, wherein the modulo unit divides the accumulated-remainder by the generator polynomial to obtain the cyclic redundancy code.

14. The device in claim 9, wherein the reciprocal-approximator for the generator polynomial comprises $X^{p+ra}/P$, where P is the generator polynomial, p is the degree of the generator polynomial, and ra is the degree of the reciprocal-approximator.

15. A method for determining a cyclic redundancy code, comprising:
   separating a message into a plurality of segments;
   multiplying each segment by a segment-constant based on a generator polynomial to obtain a plurality of segment-remainders;
   accumulating the segment-remainders to obtain an accumulated-remainder; and
   moduloing the accumulated-remainder by the generator polynomial to obtain the cyclic redundancy code for the message.

16. The method of claim 15, where a degree of a most significant bit of the generator polynomial is greater than a degree of a most significant bit of each segment.

17. The method of claim 15, comprising separating the message into three or more segments.

18. The method of claim 15, wherein multiplying each segment by a segment-constant based on a generator polynomial (P) comprises multiplying each segment by a segment-constant based on a field extension F of the generator polynomial P, wherein F is equal to P multiplied by an extender Q.

19. The method of claim 18, wherein the greatest common denominator between P and Q is one.

20. The method of claim 15, wherein cyclic redundancy code indicates a likelihood of an error in the message.

21. The method of claim 15, wherein each one the plurality of segment-constants is based on the generator polynomial and the position of the segment in the message.

22. A device that obtains a cyclic redundancy code for a message, the message separated into a plurality of segments, comprising:
   a multiplier to multiply each segment by a segment-constant to obtain a plurality of segment-remainders;
   an accumulator to accumulate the segment-remainders to obtain an accumulated-remainder for the message; and
   a modulo unit to modulo the accumulated-remainder by a generator polynomial to obtain the cyclic redundancy code for the message.

23. The device in claim 22, further comprising a memory for storing a plurality of segment-constants.

24. The device in claim 22, wherein the modulo unit modulos the accumulated-remainder by dividing the accumulated-remainder by the generator polynomial to obtain the cyclic redundancy code.

25. The device in claim 22, wherein the modulo unit multiplies the accumulated-remainder by a reciprocal-approximator for the generator polynomial to obtain the cyclic redundancy code.

26. An article comprising a machine-readable medium that stores instructions to obtain a cyclic redundancy code for a message, the instructions causing a machine to:

store a reciprocal-approximator for a generator polynomial in a storage;

separate the message into a plurality of segments;

obtain a remainder for each of the plurality of segments, including multiplying each segment by the stored reciprocal-approximator;

multiply the remainder for each segment by a segment-constant based on a generator polynomial to obtain a plurality of segment-remainders;

accumulate the segment-remainders to obtain an accumulated-remainder; and obtain the cyclic redundancy code for the message, including multiplying the accumulated-remainder by the stored reciprocal-approximator.

27. The article of claim 26, further comprising instructions that cause a machine to modulo the segments by the generator polynomial to obtain the remainder for each segment.

28. The article of claim 26, further comprising instructions that cause a machine to verify the integrity of the message if the cyclic redundancy code is zero.

29. The article of claim 26, further comprising instructions that cause a machine to invalidate the integrity of the message if the cyclic redundancy code is non-zero.

30. The article of claim 26, wherein the reciprocal-approximator for the generator polynomial comprises $X^{p+ra}/P$, where P is the generator polynomial, p is the degree of the generator polynomial, and ra is the degree of the reciprocal-approximator.

31. An article comprising a machine-readable medium that stores instructions to obtain a cyclic redundancy code for a message, the instructions causing a machine to:

separate a message into a plurality of segments;

multiply each segment by a segment-constant based on a generator polynomial to obtain a plurality of segment-remainders;

accumulate the segment-remainders to obtain an accumulated-remainder; and modulo the accumulated-remainder by the generator polynomial to obtain the cyclic redundancy code for the message.

32. The article of claim 31, further comprising instructions that cause a machine to apply a field extender to the generator polynomial.

33. The article of claim 31 in which the instructions causing the machine to multiply each segment by a segment-constant based on a generator polynomial (P) comprises instructions causing the machine to multiply each segment by a segment-constant based on a field extension F of the generator polynomial P, wherein F is equal to P multiplied by an extender Q.

34. The article of claim 33, wherein the greatest common denominator between P and Q is one.

35. A method for obtaining a cyclic redundancy code for a message, comprising:

separating the message into a plurality of segments;

obtaining a remainder for each of the plurality of segments, including multiplying each segment by a reciprocal-approximator that comprises $X^{p+ra}/P$, where P is a generator polynomial, p is the degree of the generator polynomial, and ra is the degree of the reciprocal-approximator;

multiplying the remainder for each segment by a segment-constant based on the generator polynomial to obtain a plurality of segment-remainders;

accumulating the segment-remainders to obtain an accumulated-remainder; and obtain the cyclic redundancy code for the message, including multiplying the accumulated-remainder by the reciprocal-approximator.

* * * * *